United States Patent [19]
Goldman

[11] Patent Number: 6,010,749
[45] Date of Patent: Jan. 4, 2000

[54] PROCESS FOR THE PRODUCTION OF VOLATILE METAL

[76] Inventor: Mark A. Goldman, 1396 Kinoole St., Hilo, Hi. 96720

[21] Appl. No.: 09/181,343

[22] Filed: Oct. 28, 1998

[51] Int. Cl.[7] .................................................. C23C 16/06
[52] U.S. Cl. ................. 427/248.1; 427/250; 427/255.23; 75/414; 75/639; 75/641; 75/673; 438/584; 438/687; 438/688
[58] Field of Search .................................. 75/10.29, 10.3, 75/10.31, 414, 673, 639, 641; 427/248.1, 250, 255.23; 438/584, 687, 688

[56] References Cited

U.S. PATENT DOCUMENTS

| | | |
|---|---|---|
| 1,153,786 | 9/1915 | Highfield . |
| 2,226,525 | 12/1940 | Dolan .......................................... 75/10 |
| 4,508,566 | 4/1985 | Eriksson et al. ........................ 75/10.19 |
| 4,511,601 | 4/1985 | Akse et al. . |
| 4,842,891 | 6/1989 | Miyazaki et al. . |
| 5,019,531 | 5/1991 | Awaya et al. . |
| 5,064,681 | 11/1991 | Berry et al. . |
| 5,091,209 | 2/1992 | Claverie et al. . |
| 5,213,844 | 5/1993 | Purdy . |
| 5,316,796 | 5/1994 | Awaya et al. . |
| 5,376,409 | 12/1994 | Kaloyeros et al. . |
| 5,387,315 | 2/1995 | Sandhu . |
| 5,464,666 | 11/1995 | Fine et al. . |
| 5,527,739 | 6/1996 | Parrillo et al. . |

OTHER PUBLICATIONS

IBM Corporation, Internet article: "IBM makes copper technology available for custom chips", (2 pages) Oct. 27, 1997.
Deegan et al., Nature, 389:827–829 (Oct. 23, 1997): "Capillary flow as the cause of ring stains from dried liquid drops".
Motorola Corporation, Internet article: "New Dual Inlaid Copper Interconnect", dated Sep. 30, 1997.
IBM Corporation, Internet article: "IBM introduces advanced chip technology" (2 pages)—date unknown; believed to be about Sep. 22, 1997.
Li et al., *MRS Bulletin*, pp. 15–18 (Aug. 1994) Article: "Copper–Based Metallization in ULSI Structures".
Arita el al., MRS Bulletin, pp. 68–74 (Aug. 1994) Article: "Copper Metallization Technology for Deep Submicros ULSIs".
Doppelt et al., MRS Bulletin, pp. 41–18 (Aug. 1994) Article: "Chemical Vapor Deposition of Copper for IC Metallization: Precursor Chemistry and Molecular Structure".
Gelatos et al., *MRS Bulletin*, pp. 58, 69–74 (Aug. 1994) Article: "Chemical Vapor Depositino of Copper for Advanced On–Chip Interconnects".
Arita et al., *IEDM Technical Digest*, pp. 3.1.1–3.1.4, Paper 90–39 Int'l Electron Devices Mtg., San Francisco, CA (Dec. 9–12, 1990) "CVD Copper Metallurgy for ULSI Interconnections".

*Primary Examiner*—Timothy Meeks
*Attorney, Agent, or Firm*—Brown, Martin, Haller & McClain

[57] ABSTRACT

A metal volatilization process is described in which metal oxide pieces in a reaction chamber are reduced to form reduced metal and at least a portion of that metal is volatilized and used for coating a variety of substrates, including those which are susceptible to heat damage. The metal oxides formed must have curved surfaces which maintain a non-zero contact angle with their support during reduction. Preferably the reduction phase is preceded by an oxidation phase which is conducted in the same chamber, and uses as the starting materials oxidizable metal pieces which also are curved to maintain a non-zero contact angle with the support, so that general curved shapes will be maintained throughout the oxidation and reduction phases of the process. Vacuum is unnecessary, and the process can be operated at ambient pressures. Any metal or metal oxide may be used which can be reacted under reasonable temperature conditions and which preferably obeys a power law with respect to the reaction rate of the reduction phase of the process. Preferred metals are copper, aluminum, the transition metals and the coinage metals and alloys thereof. Commonly during reduction recesses form in the residual pieces, such that the residual pieces may themselves be valuable by-products.

25 Claims, 1 Drawing Sheet

PROCESS FOR THE PRODUCTION OF VOLATILE METAL

BACKGROUND OF THE INVENTION

1. Field of the Invention

The invention herein relates to the production of volatile metals, especially copper. More particularly it relates to production of metals in a volatile state suitable for vapor deposition of such metals.

2. Description of the Prior Art

Vapor deposition of metals as coatings on substrates, including coatings which can form active metal layers of semiconductors, has been known for some time. Aluminum has been the metal most commonly used in vapor deposition for formation of semiconductor materials. Recently, however, reports have appeared in the literature describing formation of semiconductor interconnects from deposited copper.

Because vapor deposition is a convenient and effective way of depositing a pure metal on a substrate, numerous patents have been issued describing methods of volatilizing metals, including copper, for vapor deposition. In general these processes have required, as starting materials, various organic or inorganic compounds or complexes of the metal to be deposited. Other processes for volatilizing metal, either from a metal source or from a metal compound or complex source, have required the maintenance of a vacuum to achieve the volatilization. All of these processes have been complicated and expensive. In addition, where the various compounds or complexes of the metal have been used as starting materials, there is a residue of the volatilization reaction to be adequately disposed of.

It would therefore be of value to have a process which would permit the production of volatilized metal in a manner which does not require the use of compounds or complexes which are difficult to react and/or leave undesirable residues (as in chemical vapor deposition), or which does not require the production and maintenance of a high vacuum environment (as in physical vapor deposition ["PVD"]).

SUMMARY OF THE INVENTION

I have now discovered a simple method of producing pure volatilized metal, particularly copper, which uses as the starting material a quantity of the metal itself or one of its oxides, preferably the highest oxidation state oxide, and which functions, in the case of the oxide as the starting material, through a simple reduction reaction, or preferably, in the case of the metal as the starting material, through a simple oxidation/reduction pair of reactions. This process can be operated at ambient pressure and in conventional gas flow equipment which has reasonable high temperature capabilities, which is particularly advantageous in comparison with prior art PVD systems. Further, this process does not require a heated substrate onto which the metal is to be deposited; the substrate can be at ambient temperature. This allows heat-sensitive materials to be used as substrates, which is particularly advantageous by comparison to prior art chemical vapor deposition (CVD) processes.

An important part of my invention is my discovery that it is critical in the claimed process, in order to obtain its numerous advantages over prior art processes, that the starting material be in the form of curved pieces of the metal or metal oxide, which curved pieces maintain a non-zero contact angle between the outer surface of each metal or oxide piece and the support on which the piece is disposed during at least the reduction phase of the process. The substrate may be the inner surface of the reaction chamber, other pieces of the same or a different metal or oxide, or one or more separate supports placed within the reaction chamber. No vacuum is needed nor are any non-oxide metal compounds or complexes required so that the only residue at the end of the reaction is the unused portion of the original metal or metal oxide pieces. I have also found that in many cases these residual pieces have, over the course of the process, each assumed a unique hollow configuration which causes each residual piece to be independently a valuable by-product of the metal volatilization process.

In summary, my process requires disposing curved pieces of a metal oxide, whose metal component is to be volatilized, in a chamber through which a reducing gas is flowed. The chamber has an inlet end and an outlet end; the outlet end optionally has a significant restriction or constriction. After the metal oxide is placed in the chamber, it is heated to an elevated temperature, preferably within the sintering temperature range of the oxide. That temperature is then maintained while a reducing gas, such as hydrogen, is flowed over the heated metal oxide pieces. The flowing reducing gas reduces the metal oxide to metal, of which a portion is, at the temperature of the system, volatilized and entrained in the flowing reducing gas and carried downstream from the location of the reduction reaction.

Thereafter at least a portion of the reducing gas containing the entrained volatilized reduced metal is brought in contact with one or more substrates on which it is desired to coat the metal, and the metal is caused to deposit from the volatile phase onto the substrates. The deposited metal may form a uniform coating or the substrate may be configured such that the volatile metal preferentially plates out on only certain portions of the substrate, in a manner known for vapor deposition of metals. The substrate may be positioned inside the chamber or outside of it.

Numerous reducible metal oxides can be used to generate the volatile phase of their metal components by reduction, but preferred are the oxides of copper, aluminum, the transition metals and the coinage metals, as well as alloys thereof. Preferably the metal oxide must be one for which the reduction reaction follows a "power law," i.e., its rate is an exponential function of time. The most preferred oxides are the oxides of copper. It is also preferred that the metal oxide be that in which the metal is at its highest oxidation level.

In a preferred embodiment of the process, the reduction of the metal oxides is preceded by an oxidation step in which the desired metal is oxidized to the metal oxide. Metal pieces having substantially a curved shape are placed in the chamber, which is then heated to an elevated oxidizing temperature, preferably within the sintering temperature range of the metal. An oxidizing gas, such as oxygen, is then flowed over the metal while the metal is held at the elevated oxidizing temperature until the metal is oxidized to the desired metal oxide, which as noted is preferably the oxide in which the metal component is in its highest oxide state. The pieces of metal must retain some degree of curvature during oxidation as they convert to the oxide. Preferably the original curved shape of the metal pieces will be substantially held throughout oxidation and become that of the resulting metal oxide pieces, although significant reformation to another curved shape or shapes is acceptable as long as the resultant metal oxide shapes are such that they maintain the above-mentioned non-zero contact angle with the support during the subsequent reduction steps.

In many cases it is found that at least a portion of the residual metal or metal oxide fragments remaining after reduction is completed or terminated have assumed hollow or partially hollow configurations. For instance, where I have started with a wire piece, such as a copper wire piece, I have observed that upon completion or termination of the process following oxidation and reduction, the wire shape has been substantially maintained, and a number of the original wire pieces have become hollow, with an open hole through the remaining wire fragment. In others at least one recess has been formed. Usually the recesses are on or substantially parallel to the longitudinal axis of an elongated piece, such as a piece of wire.

In a broad embodiment, therefore, the invention is a process for the production of volatile metal which comprises placing at least one curved piece of a metal oxide within a hollow chamber having open inlet and outlet ends; bringing the metal oxide in the chamber to a first temperature at which at least a portion of the metal oxide becomes sintered, with the metal oxide continually maintaining an outer surface sufficiently curved to maintain a non-zero contact angle with a supporting member within the chamber; and while at the first temperature, flowing a reducing gas through the chamber from the inlet end to the outlet end and in contact with the metal oxide for a period of time sufficient to reduce at least a portion of the metal oxide to reduced metal and volatilize at least a portion of the reduced metal.

In a preferred embodiment, the invention further includes prior formation of the metal oxide by placing at least one curved piece of an oxidizable metal within the hollow chamber having open inlet and outlet ends; bringing the metal in the chamber to an elevated second temperature at which oxidation of the metal occurs at an acceptable rate; and while at the second temperature, flowing an oxidizing gas through the chamber from the inlet end to the outlet end and in contact with the metal for a period of time sufficient to oxidize the metal to the metal oxide.

Also a feature of the invention are the unique residual pieces of metal or metal oxide which have been hollowed or in which recesses have been formed by the process.

As noted, a critical element of the present invention is the maintenance of a non-zero contact angle between the shaped metal oxides (and preferably also any metal precursors) and the support or conduit surface on which the metal oxides are supported. As will be explained below, it is believed that it is the non-zero contact angle which is maintained which allows the process to be performed using the pieces themselves as the source of the vaporized metal and which allows the process to proceed in the absence of any non-oxide metal compounds or complexes or a vacuum environment.

DETAILED DESCRIPTION AND PREFERRED EMBODIMENTS

Figure 1:
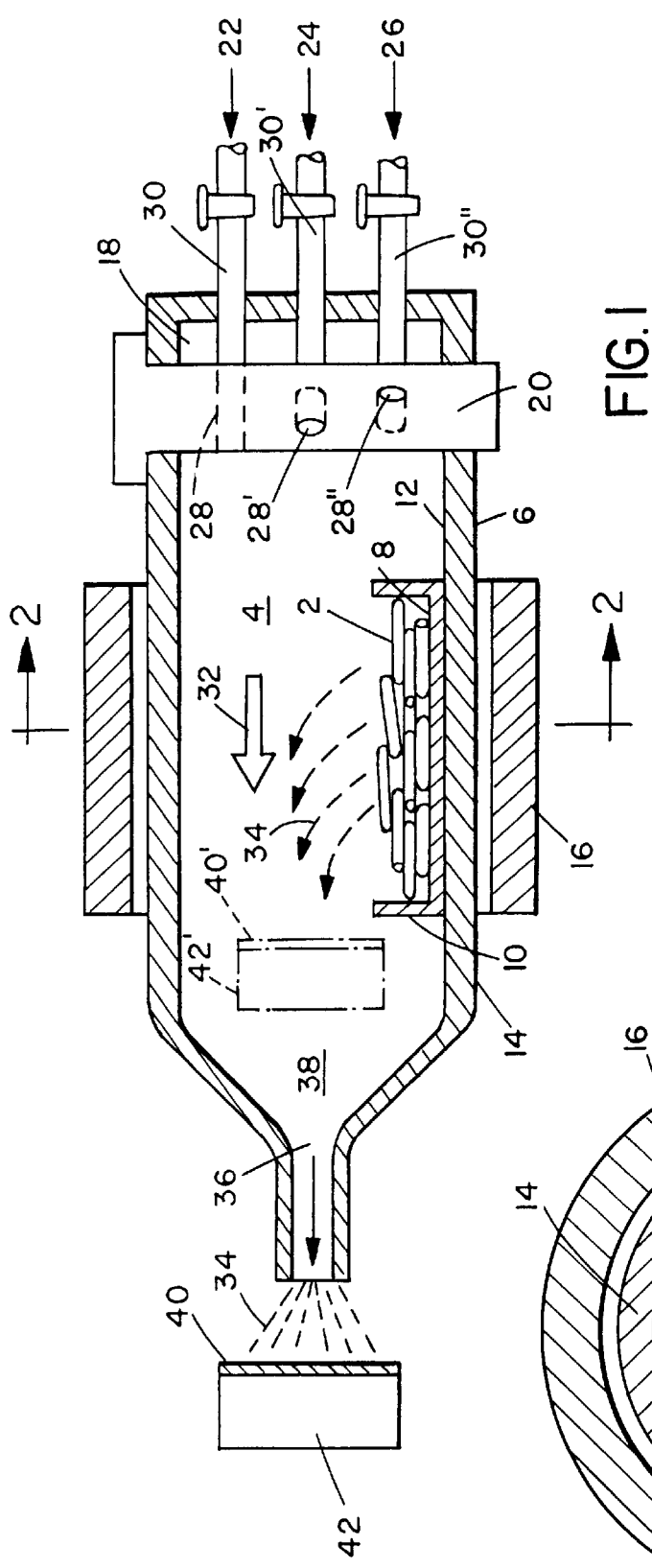
FIG. 1 is a schematic side elevation view, partially in section, of apparatus for the performance of the process of this invention.

For purposes of brevity, the process herein will be exemplified by formation of volatilized copper from initial curved pieces of copper. Most conveniently, the curved pieces will be in the form of short lengths of copper wires, commonly 1"–3" (2.5–7.5 cm) long, and of relatively small gauge, such as about 26–22 gauge (American Wire Gauge; 0.0159–0.0253 in. dia. [0.405–0.644 mm dia.]). It will be understood, however, that other metals can be volatilized according to the present process, as long as they can be oxidized and then reduced to produce volatile metal while maintaining a non-zero contact angle with their support at least during reduction, and which preferably obey a power law during reduction. Examples of metals which meet these criteria are aluminum, the transition metals and the coinage metals and alloys thereof. For the purpose of this invention, the transition metals are considered to be those in Group 8B of the Periodic Table, or metals having substantially equivalent oxidation/reduction properties. The coinage metals are considered to be those in Groups 1B and 2B of the Periodic Table, or metals having substantially equivalent oxidation/reduction properties. Alloys of these metals may be used where deposition of multiple metal elements is intended or can be tolerated.

The process will be best understood by considering a typical example. This example includes both the oxidation and reduction phases of the process of the invention. It will be understood that it is not necessary that the oxidation be a part of the process, since suitably shaped metal oxide precursors can be obtained commercially. It is preferred, however, that the process be conducted with both phases, and that it start with oxidizable metal pieces, since this allows the entire process, including subsequent deposition of the volatile metal onto the desired substrates, to be conducted in a single reaction system. This permits close control of the entire operation and avoids potential contamination of the metal oxide which could occur if it were formed elsewhere and then transferred at some later time to the reduction chamber for the reduction phase of the process.

In the example, several short pieces of common copper wire of about 1"–3" (2.5–7.5 cm) in length are converted in part to volatile copper metal, which then can be vapor deposited on appropriately placed substrates. The copper wires are placed inside a hollow glass or quartz chamber, conveniently in the form of a conduit with an inlet end and an outlet end, and which is capable of operating at elevated temperatures. The inlet end is adapted to be connected to sources of oxidizing, reducing and (optionally) purging gases. Where the substrate to be coated is disposed within the chamber, the outlet end serves primarily as an exhaust port for the reducing gas from which entrained metal has been removed by such deposition. If the substrate to be coated is disposed outside the chamber, the outlet end is preferably significantly constricted so that as the reducing gas stream in which the volatile metal to be deposited is entrained passes through the constriction where the diameter of the flow stream is reduced and the flow rate is accelerated, so that the stream may be more precisely aimed at the substrate following exit of the gas mixture of reducing gas and entrained volatile metal. Placing the substrate outside the chamber also results in additional cooling of the volatile metal prior to deposition.

After placement in the chamber, the copper wires are then heated to an elevated temperature. The specific temperature is not critical, although temperatures so high that the metal is melted or the shapes of the pieces significantly changes are to be avoided. With this limitation, higher temperatures are preferred since they result in faster oxidation rates. Conveniently the elevated temperature is within the sintering temperature range of copper. For the purposes of this invention, "sintering temperature range" means a temperature at which at least some of the metal (or metal oxide) sinters, but below its melting point. It is known that metals and metal oxides do not have precise "sintering temperatures" as they do melting temperatures. Rather sintering occurs over a range of temperatures which are usually about 65%–85% of the melting temperature. Those skilled in the art will be aware that the rate of sintering increases with increasing temperature within the sintering temperature range, and they will be readily able to determine the optimum operating temperature within that range for each particular metal of interest and with the specific heating and reaction equipment available. For copper useful "sintering temperatures" are in the range of about 700°–900° C. (1292° 1652° F.). Other metals of course have their own sintering temperature ranges.

The copper metal pieces are maintained at that elevated temperature while an oxidizing gas, preferably oxygen, is flowed over the hot copper wires for a period of time sufficient to convert substantially all of the copper to a copper oxide by the contact between the hot copper wires and the flowing oxidizing gas. The oxide form normally finally obtained is usually CuO or Cu(II)O. Preferably the reaction is continued until substantially all of the copper wires have been converted to the oxide(s). The oxidation reaction normally does not substantially change the shapes of the pieces of oxidized metal, so that the non-zero contact angle between each piece and its support is maintained. However, for those metals which do change shape during oxidation, it is important that the oxide product maintain a curved shape (albeit a different curved shape) such that there is still a non-zero contact angle between the oxide pieces and their supports. Normally the metal oxide will not be deliberately moved between the oxidation and reduction phases of the process.

After the copper has been substantially fully oxidized, the temperature is changed, if necessary, to a second elevated temperature which is within the sintering temperature range of the copper oxide. Preferably for a copper oxide this "sintering temperature" will be in the range of 675°–875° C. (1247°–1607° F.); those skilled in the art will be readily able to determine the optimum temperature of the metal oxide of interest with the equipment available.

It is preferred to pass a substantial quantity of an inert purging gas through the chamber between the oxidation and reduction steps of the process, to purge the chamber of any residual oxidizing gas. Such an inert gas may be nitrogen or argon. This prevents unsafe situations where incoming reducing gas encounters hot residual oxidizing gas and a violent reaction could occur.

For most metal oxides, the oxide sintering temperature range will be higher than the range of oxidation of the metal, so to obtain the proper temperature in the reduction step will require an elevation in the operating temperature from the range applicable to oxidation of the precursor metal. Once the metal oxide's elevated temperature has been reached, a reducing gas such as hydrogen is flowed through the chamber while the metal oxide's elevated temperature is maintained. The contact between the reducing gas and the metal oxide at the elevated temperature gradually converts the copper oxide to copper metal, at least a portion of which becomes volatilized at the temperature being maintained. The volatilized copper metal becomes entrained in the flowing stream of reducing gas and is conveyed downstream from the reduction reaction area.

The volatilized copper is deposited on a substrate as a coating either in a deposition zone within the reaction chamber or conduit or in a deposition zone on the exterior of the chamber. If the deposition zone is positioned outside of the chamber, it is preferred to have a constriction in the exit end of the conduit to cause an increase in the flow rate of the exiting reducing gas stream containing the entrained copper metal and to make easier the conveyance of the gas stream to contact with the substrate(s) upon which the copper is to be deposited.

As the reducing gas and the volatilized metal cool upon movement downstream away from the reduction reaction area where the metal oxide pieces are, some condensation or plating out of the copper metal on the interior surfaces of the chamber may occur. The amount of internal chamber plating will be dependent upon the operating temperature and temperature gradients within the chamber and of the flow rate of the volatilized metal in the reducing gas through the chamber. Those skilled in the art of vapor deposition will be readily able to determine the optimum temperature and gas flow rate within the chamber, so that only minimal internal surface plating out or coating will occur, and the optimum proportion of the volatilized entrained metal will be transported to the substrate(s) upon which the copper is to be plated.

During the course of reduction, it has been observed that the copper oxide materials usually retain the original solid wire configuration, but slowly are transformed into hollow wire configurations. Specifically, I have observed that a generally axial central cavity forms in each wire piece so that eventually, as more and more copper is volatilized, the wire shapes go from being a solid cylindrical configuration to having a "central" recess, to the recess in some cases eventually extending longitudinally through the piece to create a hollow cylindrical configuration. The remaining copper becomes concentrated in the corresponding annular wall surrounding the axial cavity. (By "central" it is meant that the recess forms with a generally annular wall around it, so that it is in the "central" portion of the piece. It may or may not be precisely aligned with the longitudinal axis of the piece.) These hollow wires may themselves be valuable by-products for various uses, depending on the type of metal involved and the oxide content still remaining in the residual fragments. While the cylindrical wires produced hollow cylindrical metal products, other hollowed configurations may also be obtained depending on the initial shape of the metal oxide, as will be discussed below.

The reduction reaction is continued until a predetermined quantity of metal has been volatilized and deposited on the intended substrates. Normally, this reaction is run such that there is an excess of copper originally present and at the end of the reduction reaction usually a residue of mixed copper metal and copper oxide is all that remains, although with a sufficient excess of reducing gas and a sufficiently long run, a final product formed substantially entirely of copper metal can be obtained.. As noted above, where the hollow wire configuration has been obtained, those residual bodies may be recovered as desirable by-products.

The entire operation may be run under ambient or slightly elevated pressures of the flowing oxidizing or reducing gases. No vacuum is required either in the oxidation/reduction area of the conduit or in the metal deposition chamber portion.

While the exact mechanism of the present reaction is not completely understood, it is believed that the copper (or other metals useful in this process) follows a power law with respect at least as to the reduction reaction; i.e., that the rate of the reduction reaction and metal volatilization must be an exponential function of the duration of time of the reaction. Under the temperature conditions of the current process, it is believed that vacancies in the CuO crystal structure may result from the evaporation of the copper at the edge of the wire. As these vacancies are formed, and if the diffusion rates of the vacancies, copper atoms and oxygen atoms are all different (the "Kirkendall Effect"), the vacancies may migrate into the center of the wire, thus resulting in a transport of copper atoms from the inner to the outer portions of the wire, resulting in the formation of the recess or hollow in the central portion of the wire, as noted above. Mobility of atoms and vacancies is greatly enhanced when temperatures are withing the sintering temperature range of the metal oxide. Another mechanism which may be in effect is capillary flow of the metal, occurring within the oxide being reduced, which causes the metal to move toward the perimeter of the wire body. Migration of the copper metal from the interior gradually causes the central axial cavity to form. As discussed by Deegan et al., *Nature*, 389:827–830 (Oct. 23, 1997), materials which obey a power law with respect to evaporation or volatilization experience capillary flow toward the outer surface of the body of the material if there is a non-zero contact angle between the material and its support. Deegan et al. discuss this in the context of an evaporating drop of coffee, which is a suspension of extracts of coffee beans suspended in a water carrier. I believe that, although metal is of course different from coffee, the theory and mechanisms described by Deegan et al. may also be applicable to the reduction step of the present invention, with copper metal migrating to the outer surface of the wire shape as reduction continues. Observation of the formation of the "central" recesses and hollows in the wire-shaped pieces is believed to offer confirmation, as being analogous to the formation of a central void within a ring of dried coffee extracts as the liquid phase of the coffee drop evaporates, described by Deegan et al. The observation that the recesses and hollows are "central" but not necessarily exactly "co-axial" reflects that radial diffusion or migration rates are not absolutely uniform at all points in the structure of the pieces.

In addition to the use of the present process to form a volatile metal for vapor deposition of the metal, the process can also be viewed as a method for the formation of hollow cylindrical or other shapes of the various metals. In such cases, the volatilized metal would be drawn off and used for vapor deposition or otherwise coated out, perhaps for recycle, while the reduced metal shapes with the formed cavities would be recovered and cooled to form the desired product.

While the reaction above has been described in terms of cylindrical copper wire, as noted it is not necessary that the pieces of metal be initially cylindrical. Rather, the requirement is that at least during the reduction reaction, the various pieces of the oxidized metal must maintain non-zero contact angles with their underlying support. For instance, the metal oxide pieces undergoing reduction may have been initially spherical, ellipsoidal, ovoid, helical or may be curved in irregular patterns including lobate (see Deegan et al., supra), spherical, kidney-shaped and the like. Only those surfaces which will not come into contact with the underlying support (such as the end surfaces of cylindrical pieces of wire), may be uncurved (i.e., flat) surfaces. The sizes or overall dimensions of the piece or pieces of metal oxide are not critical. It is anticipated, however, from normal reaction kinetics for oxidation and reduction reactions, that a plurality of smaller pieces with proportionately higher external surface areas will react faster than large pieces with proportionately smaller external surface areas. The particular number and size of the pieces may be chosen by the operator primarily with regard to the amount of deposited metal which is desired for the coated substrate products or the size of hollow cylindrical or other shaped products to be produced.

Oxidizing gases other than oxygen may be used in the reaction, as long as they do not cause undesirable side reactions between the metal and other elements of the gaseous compound or other gaseous components of the gas stream. Similarly, other reducing gases than hydrogen may be used, but with the same type of limitations—that during the reduction undesired side reactants with the metal oxides are not formed in any significant quantity. It is also possible to use vaporized liquids for either oxidation or reduction as, for instance, by bubbling an inert gas such as nitrogen or argon through an oxidizing or reducing liquid and using the liquid entrained in the inert gas stream after the gas is bubbled through the liquid as the oxidizing or reducing gas. Of course, as noted above, similar restrictions will apply to the volatilized entrained liquid reducing or oxidizing agent as applies to an initially gaseous oxidizing or reducing agent.

Figure 2:
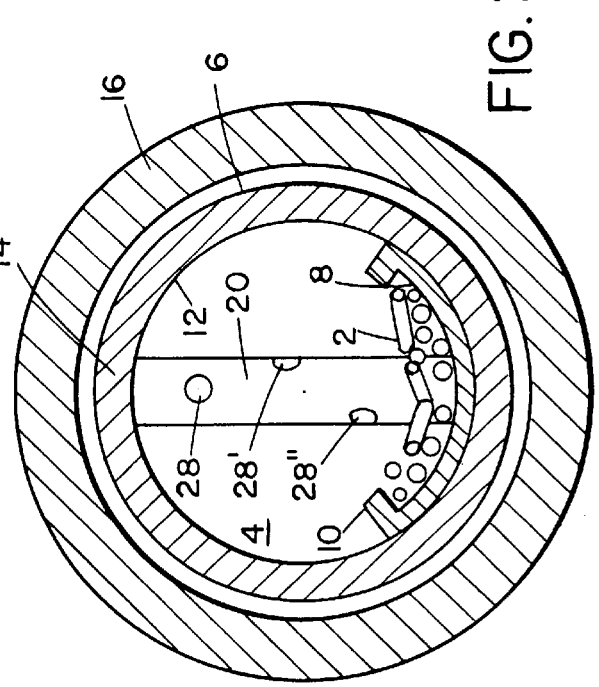
FIG. 2 is a cross-sectional view taken on Line 2—2 of FIG. 1.

Operation of the process can be illustrated by the schematic diagrams of FIGS. 1 and 2. Curved metal samples 2, exemplified by copper wires having lengths of about 1"–3" (25–75 mm), are placed in chamber 4 formed as the interior of a glass or quartz conduit 6. In this example the samples 2 are supported by the bottom surface 8 of an open container 10 placed on the inside surface 12 of the wall 14 of conduit 6. Alternatively, the samples 2 could be placed on the curved inside surface 12 of the wall 14, or there could be a pile of samples 2 with the lower ones supporting the upper ones (in which arrangement the upper samples more completely oxidized because of their greater contact with the oxidizing gas), or the copper samples 2 could be supported by an underlying layer of pieces of a different (usually more oxidation resistant) metal. A heating element 16 is positioned surrounding and closely adjacent to conduit 6 to heat the samples 2 (by heating the conduit 6) to the sintering temperature ranges required in the oxidation and reduction steps.

The conduit 6 has an inlet end 18 at which is mounted a stopcock 20 or similar valving device which allows for separate admission of the oxidizing gas 22, the reducing gas 24 and the optional purging gas 26 to the chamber 4. The stopcock 20 has a plurality of passages 28, 28' and 28", aligned at 120° to each other, each of which can thus be sequentially aligned with a different gas inlet conduit 30, 30' and 30" for admission of each of the various gases individually. Neither the number of gas inlet conduits 30, 30', 30" nor the exact nature of the stopcock 20 device is critical, as long as the apparatus is such that the gases can be separately admitted to the chamber 4. The various gases may be provided by gas sources (not shown) such as supply tanks or cylinders.

The oxidizing gas 22 and the reducing gas 24 each flows through the interior of chamber 4, as indicated by arrow 32, and passes over, respectively, the heated metal wires or the heated metal oxides to effect, respectively, oxidation of the metal or reduction of the metal oxide. The latter results in the production of volatilized copper metal 34, which becomes entrained in the flowing reducing gas stream. The exiting reducing gas passes through constriction 36 in outlet end 38 of conduit 6, and is directed to a chemical vapor deposition chamber for deposition of the entrained volatilized metal 34 as a copper coating 40 on substrate 42. After the reduction is completed, the furnace 16 can be turned off and the conduit 6 and residual metal or metal/metal oxide wires or wire fragments allowed to cool. When the residual wires or wire fragments are retrieved, they will commonly be found to have central or other hollows and recesses, as described above.

FIG. 1 also illustrates placing the substrate 42 at an alternate internal location within conduit 6 between the metal oxide location and the outlet end 38, as indicated by substrate 42' with deposited copper coating 40'. Placing the substrate 42' for deposition of the coating 40' at the internal location will normally mean that the coated substrate cannot be retrieved until the conduit 6 has been cooled and opened.

The purging gas 26 is also flowed through the chamber 4 in the same manner as described above for the other gases, but serves only to purge the residual quantities of the preceding oxidizing gas 22 to prevent undesired reactions with the subsequent reducing gas 24. Of course, if desired, purging gas 26 can also be passed through the chamber 4 following the passage of the reducing gas 24. Since the furnace 16 will at that time be turned off, the passage of the cool purge gas 26 may assist in the cooling down of the interior of the conduit 6 and of the residual metal or metal/metal oxide pieces.

Further, while the invention has been described above for use in the deposition of metal for semiconductor fabrication, it will be evident that it has numerous other uses. It can of course be used to deposit other volatile metals on substrates other than semiconductor precursors, to form other types of metal coated or layered products. These can include, but are not limited to, formation of coated metal contacts in switches and other electrical devices, formation or coated metals in arrays such as screens, and so forth. Also, because heating of the substrate is not needed for deposition, substrate materials which are susceptible to heat damage at elevated temperatures can be used. Thus the process can be used to coat metals onto cloth and fiber fabrics, papers, woods and the like. Those skilled in the art will be able to readily identify other uses not specifically mentioned herein but fully within the scope of the invention.

It will be evident from the above that there are numerous embodiments of this invention which, while not expressly described herein, are clearly within the scope and spirit of the invention. The above description is therefore intended to be exemplary only, and the scope of the invention is to be limited solely by the appended claims.

I claim:

1. A process for the production of volatile metal which comprises:
   a. placing at least one curved piece of an oxidizable metal in a vessel;
   b. bringing said metal in said vessel to an elevated first temperature at which oxidation of said metal occurs at an acceptable rate;
   c. while at said first temperature, contacting said metal with an oxidizing gas for a period of time sufficient to oxidize said metal to a resultant metal oxide;
   d. placing at least one curved piece of said metal oxide within a hollow chamber having open inlet and outlet ends;
   e. bringing said metal oxide in said chamber to a second temperature, with said metal oxide continually maintaining an outer surface sufficiently curved to maintain a non-zero contact angle with a supporting member within said chamber; and
   f. while at said second temperature, flowing a reducing gas through said chamber from said inlet end to said outlet end and in contact with said metal oxide for a period of time sufficient to reduce at least a portion of said metal oxide to reduced metal and volatilize at least a portion of said reduced metal.

2. A process in claim 1 wherein said metal oxide is reduced at a rate which is an exponential function of time.

3. A process as in claim 1 wherein said metal oxide comprises an oxide of copper, aluminum, a transition metal or a coinage metal.

4. A process as in claim 1 wherein said reducing gas comprises hydrogen.

5. A process as in claim 1 wherein said reducing gas comprises a vaporized liquid chemical which has reducing properties.

6. A process as in claim 1 wherein during the course of said reduction, a recess and/or hollow is formed in said metal oxide piece.

7. A process as in claim 6 wherein the shape of said curved metal oxide piece is generally maintained during at least a portion of said reduction to metal.

8. A process as in claim 7 wherein said metal piece has a generally spherical, ellipsoidal, ovoid, cylindrical or helical shape.

9. A process as in claim 7 wherein said curved metal oxide piece has a generally elongated curved shape having a longitudinal axis, and said recess and/or hollow is formed generally along or parallel to said axis.

10. A process as in claim 1 wherein said oxidizing gas comprises oxygen.

11. A process as in claim 1 wherein said oxidizing gas comprises a vaporized liquid chemical which has oxidizing properties.

12. A process as in claim 1 wherein said metal piece has a generally spherical, ellipsoidal, ovoid, cylindrical or helical shape, and said shape is generally maintained during said oxidation to said metal oxide and during at least a portion of said subsequent reduction to metal.

13. A process as in claim 12 wherein said curved metal piece comprises a length of metal wire.

14. A process as in claim 1 further comprising, following said reduction and volatilization of said reduced metal, entraining at least a portion of said volatilized reduced metal in at least a portion of said reducing gas, conveying said entrained volatilized reduced metal to a substrate and depositing said portion of said volatilized reduced metal on a surface of said substrate.

15. A process as in claim 14 wherein said substrate comprises a semiconductor precursor and said reduced metal deposited thereon comprises at least a portion of a functional layer of a semiconductor.

16. A process as in claim 15 wherein said reduced metal comprises copper, aluminum, a transition metal or a coinage metal.

17. A process as in claim 14 wherein said substrate is disposed within said chamber downstream of a position of said metal oxide.

18. A process as in claim 14 wherein said substrate is disposed exteriorly of said chamber and at least a portion of said reducing gas containing said entrained volatilized reduced metal is conveyed from the interior of said chamber to said substrate through said outlet end.

19. process as in claim 18 wherein said outlet end of said chamber has a restriction therein, such that a flow rate of said reducing gas containing said entrained volatilized metal which passes through said outlet end to the exterior of said conduit is accelerated.

20. A process as in claim 1 further comprising during steps b. and c. continually maintaining an outer surface of said metal sufficiently curved to maintain a non-zero contact angle with a supporting member within said vessel.

21. A process as in claim 1 further comprising at a portion of said metal in step b. or said metal oxide in step e. also becoming sintered.

22. A process as in claim 1 wherein said vessel of step a. comprises a hollow chamber.

23. A process as in claim 22 wherein said hollow chamber of step a. and said hollow chamber of step d. are the same hollow chamber.

24. A process as in claim 23 further comprising following said oxidation and prior to said reduction, passing an inert gas through said chamber to purge said chamber of residual oxidizing gas.

25. A process as in claim 24 wherein said inert gas comprises nitrogen or argon.

* * * * *

UNITED STATES PATENT AND TRADEMARK OFFICE
CERTIFICATE OF CORRECTION

PATENT NO.    : 6,010,749
DATED         : January 4, 2000
INVENTOR(S)   : Goldman, Mark A.

It is certified that error appears in the above-identified patent and that said Letters Patent is hereby corrected as shown below:

<u>Column 10,</u>
Line 43, after "19." and before "process", insert -- A --.

Signed and Sealed this

Eleventh Day of June, 2002

Attest:

Attesting Officer

JAMES E. ROGAN
Director of the United States Patent and Trademark Office